(12) United States Patent
Winter

(10) Patent No.: US 10,982,336 B2
(45) Date of Patent: Apr. 20, 2021

(54) METHOD FOR ETCHING A METAL SURFACE

(71) Applicant: WAYNE STATE UNIVERSITY, Detroit, MI (US)

(72) Inventor: Charles H. Winter, Bloomfield Hills, MI (US)

(73) Assignee: WAYNE STATE UNIVERSITY, Detroit, MI (US)

( * ) Notice: Subject to any disclaimer, the term of this patent is extended or adjusted under 35 U.S.C. 154(b) by 0 days.

(21) Appl. No.: 16/090,307

(22) PCT Filed: Mar. 31, 2017

(86) PCT No.: PCT/US2017/025270
§ 371 (c)(1),
(2) Date: Oct. 1, 2018

(87) PCT Pub. No.: WO2017/173212
PCT Pub. Date: Oct. 5, 2017

(65) Prior Publication Data
US 2019/0112716 A1    Apr. 18, 2019

Related U.S. Application Data

(60) Provisional application No. 62/316,903, filed on Apr. 1, 2016.

(51) Int. Cl.
*C23F 4/00*     (2006.01)
*C23C 16/455*   (2006.01)
*C23F 1/00*     (2006.01)
*C23F 1/12*     (2006.01)
*C23C 16/56*    (2006.01)

(52) U.S. Cl.
CPC .......... *C23F 4/00* (2013.01); *C23C 16/45553* (2013.01); *C23C 16/56* (2013.01); *C23F 1/00* (2013.01); *C23F 1/12* (2013.01)

(58) Field of Classification Search
None
See application file for complete search history.

(56) References Cited

U.S. PATENT DOCUMENTS 5,705,443 A    1/1998    Stauf et al.
8,907,115 B2   12/2014   Winter et al.
(Continued)

FOREIGN PATENT DOCUMENTS

EP    2476777 A1    7/2012

OTHER PUBLICATIONS

International Search Report dated Jul. 11, 2017 for PCT/US2017/025270 filed Mar. 31, 2017, 3 pgs.
(Continued)

*Primary Examiner* — Shamim Ahmed
(74) *Attorney, Agent, or Firm* — Brooks Kushman P.C.

(57) ABSTRACT

A method for etching a metal surface includes a step of contacting a metal surface with a protic compound for a first time period to produce a first modified surface. The first modified surface is contacted with a protic ligand-forming compound that reacts with the first modified surface to form a volatile metal-containing compound including a metal atom and the protic ligand-forming compound. The volatile metal-containing compound is removed from the vicinity of the metal surface.

31 Claims, 14 Drawing Sheets

(56) References Cited

U.S. PATENT DOCUMENTS

| | | |
|---|---|---|
| 9,255,327 B2 | 2/2016 | Winter et al. |
| 10,256,108 B2 * | 4/2019 | Fischer ............... C23C 16/0245 |
| 2002/0001929 A1 | 1/2002 | Biberger et al. |
| 2004/0118812 A1 * | 6/2004 | Watkins .................... C23F 1/16 |
| | | 216/83 |
| 2008/0115627 A1 * | 5/2008 | Wang ................. B01D 11/0203 |
| | | 75/718 |
| 2012/0058270 A1 | 3/2012 | Winter et al. |
| 2014/0234550 A1 | 8/2014 | Winter et al. |
| 2014/0273492 A1 * | 9/2014 | Anthis .............. H01L 21/32135 |
| | | 438/720 |
| 2015/0159273 A1 | 6/2015 | Winter et al. |
| 2015/0270140 A1 * | 9/2015 | Gupta ............... H01L 21/32136 |
| | | 216/67 |
| 2016/0032460 A1 | 2/2016 | Schmiege et al. |

OTHER PUBLICATIONS

European Extended Search Report dated Nov. 18, 2019 for EP Appn. No. 17776739.9 filed Oct. 10, 2018, 11 pgs.

\* cited by examiner

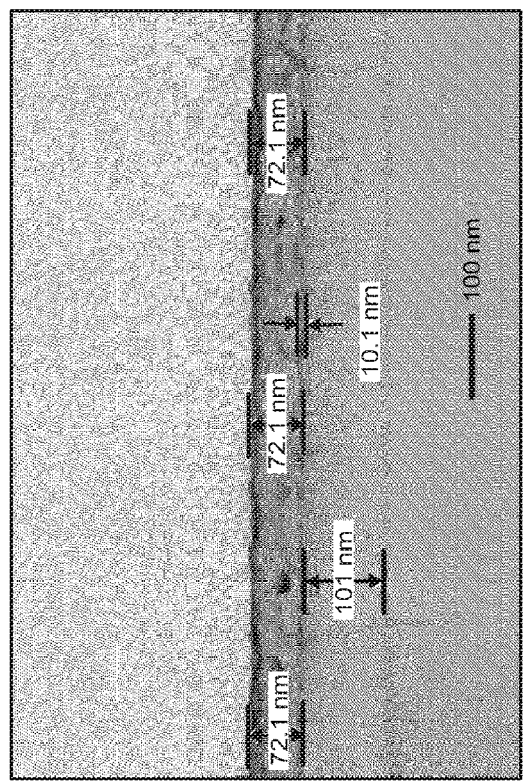
FIG. 2A
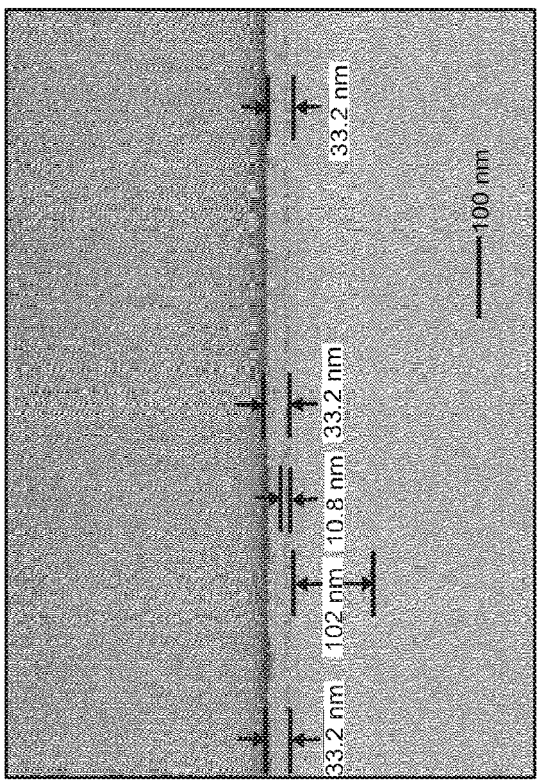
FIG. 2B
|  | Before Etching | After Etching at 150 °C |
|---|---|---|
| thickness (nm) | 72 | 33 |
| resistivity (μΩ-cm) | 23.14 | 13.09 |
| thickness difference (nm) | Summary | 39 |
| etch rate | 0.39 Å/cycle | |
FIG. 2C

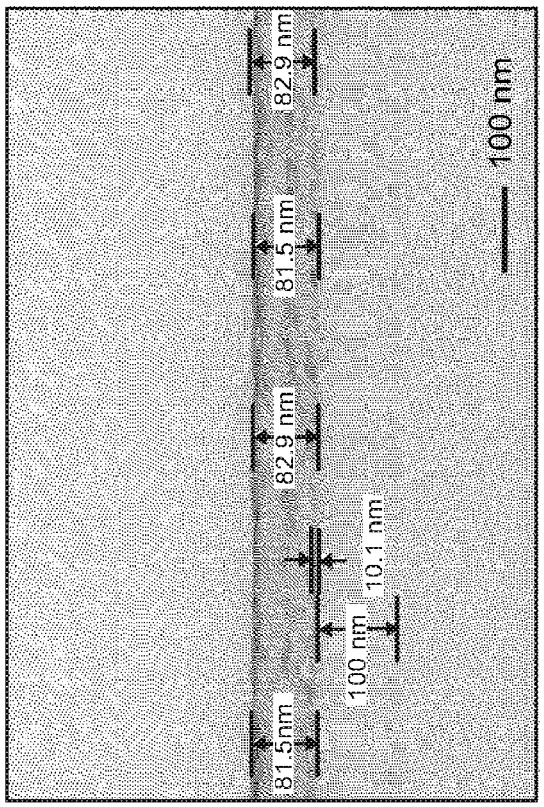
*FIG. 3A*
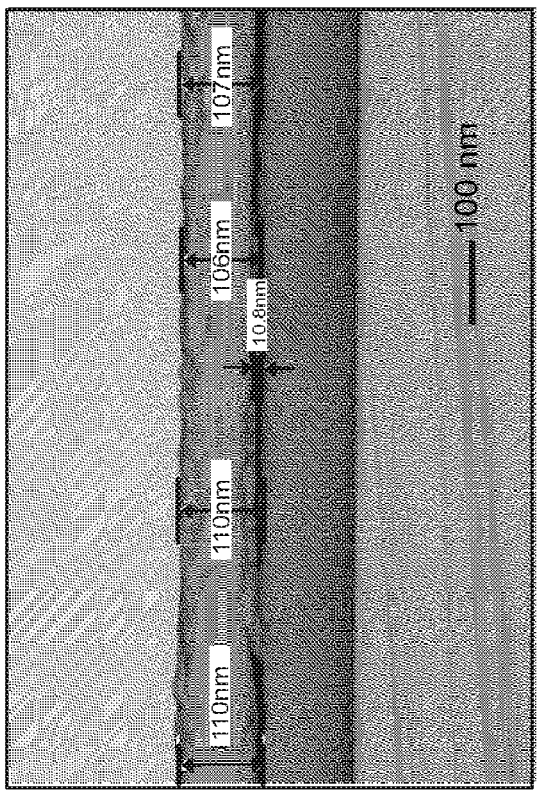
*FIG. 3B*
|  | Before Etching | After Etching at 160 °C |
|---|---|---|
| thickness (nm) | 107 | 82 |
| resistivity (μΩ - cm) | 18.39 | 17.59 |
| thickness difference (nm) | Summary | |
| | 25 | |
| etch rate | 0.25 Å/cycle | |
*FIG. 3C*

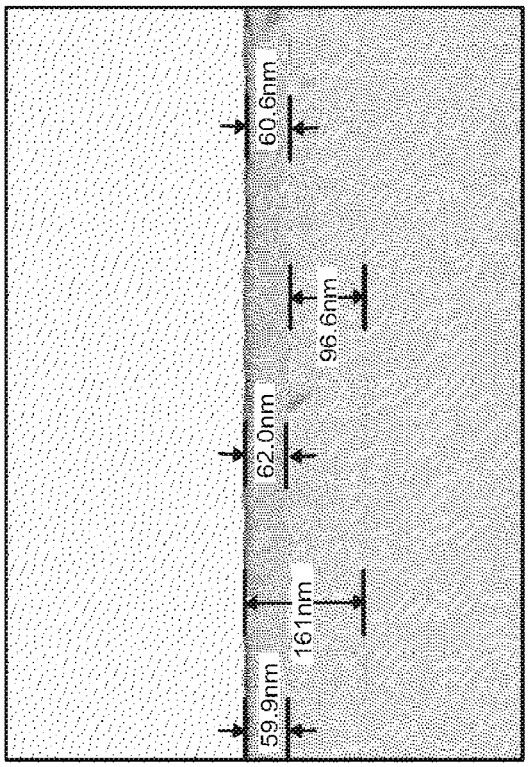
FIG. 4A
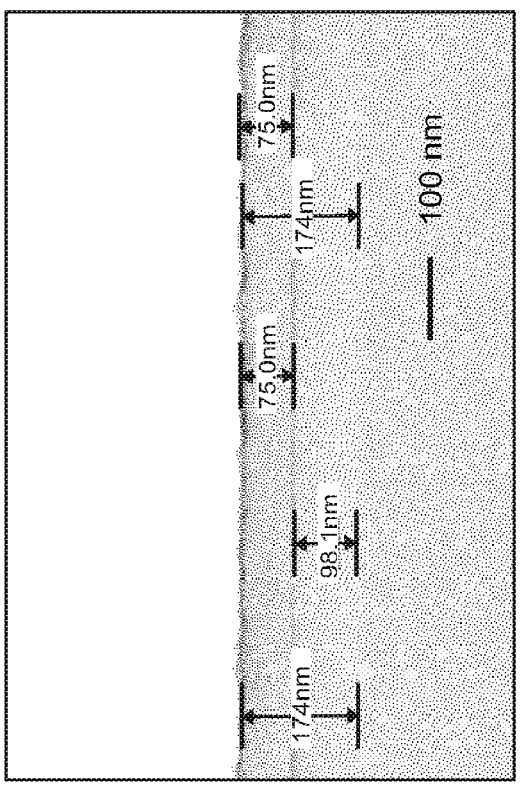
FIG. 4B
| | Before Etching | After Etching at 180 °C |
|---|---|---|
| thickness (nm) | 64 | 52 |
| resistivity (μΩ - cm) | 12.43 | 16.71 |
| thickness difference (nm) | Summary | 12 |
| etch rate | | 0.12 Å/cycle |
FIG. 4C

|  | Before Etching | After Etching at 200 °C |
|---|---|---|
| thickness (nm) | 55 | 44 |
| resistivity (μΩ - cm) | 25.83 | 24.20 |
| thickness difference (nm) | Summary | 11 |
| etch rate | 0.11 Å/cycle | |

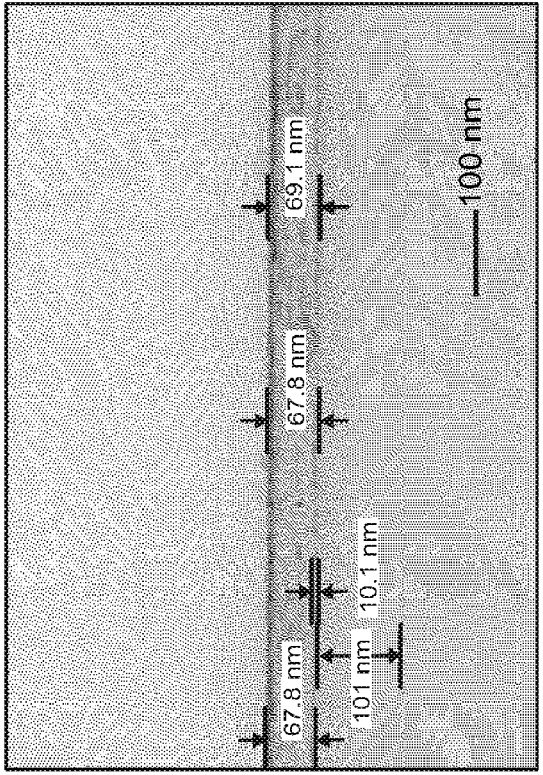
FIG. 6B
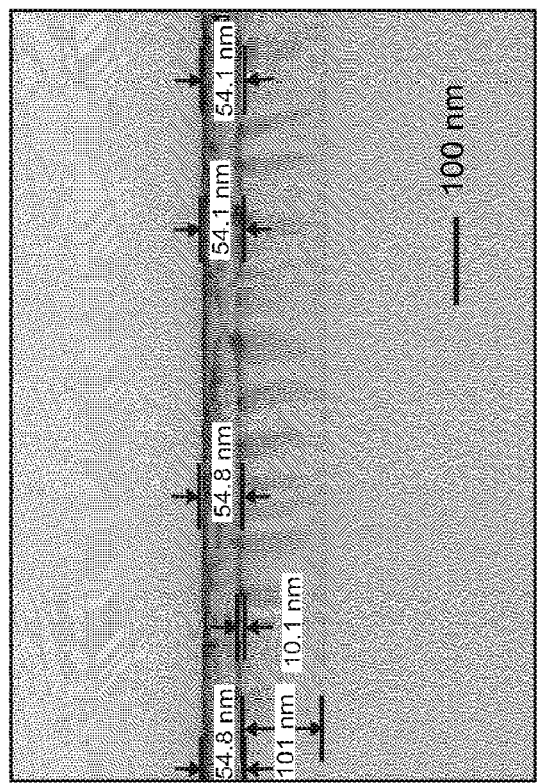
FIG. 6A
| | Before Etching | After Etching at 220 °C |
|---|---|---|
| thickness (nm) | 54 | 68 |
| resistivity (μΩ - cm) | 25.5 | 31.62 |
| | Summary | |
| thickness difference (nm) | 14 | |
| growth rate | 0.14 Å/cycle | |
FIG. 6C

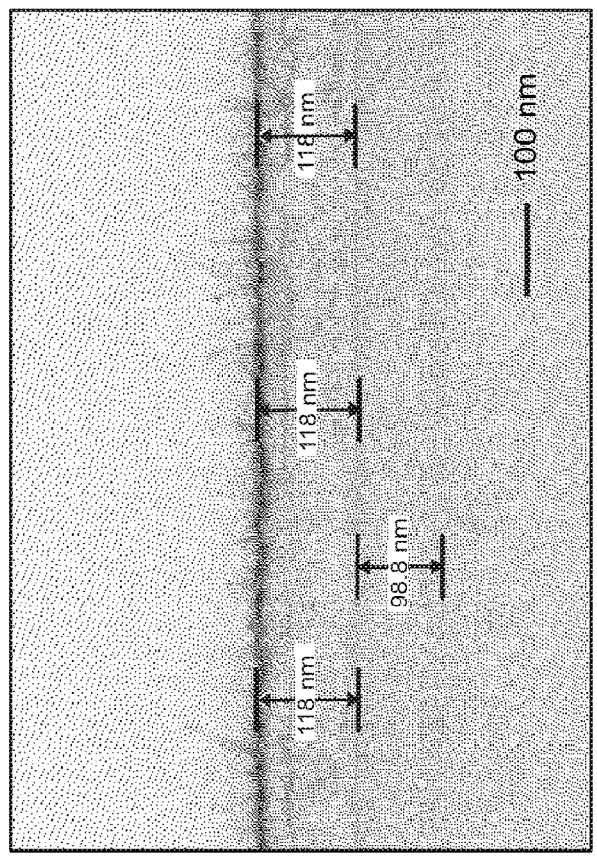
*FIG. 7A*
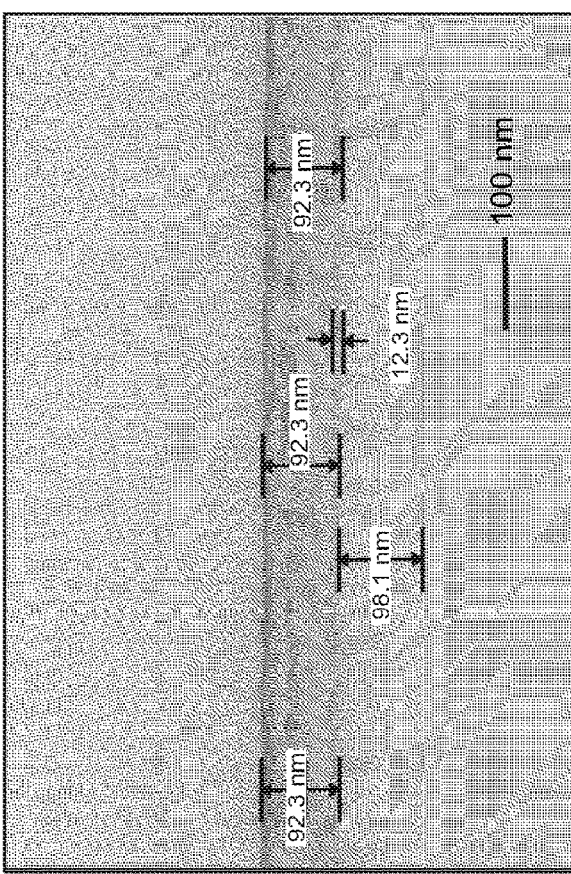
*FIG. 7B*
|  | Before Etching | After Etching at 240 °C |
|---|---|---|
| thickness (nm) | 94 | 117 |
| resistivity (μΩ - cm) | 16.22 | 20.56 |
| thickness difference (nm) | Summary | |
|  | 23 | |
| growth rate | 0.23 Å/cycle | |
*FIG. 7C*

| Temperature (°C) | Thickness difference (nm) | ER/GR |
|---|---|---|
| 150 | -39 | -0.39 |
| 160 | -25 | -0.25 |
| 180 | -12 | -0.12 |
| 200 | -11 | -0.11 |
| 220 | 14 | 0.14 |
| 240 | 23 | 0.23 |

|  | Before Etching | After Etching for 1000 cycles |
|---|---|---|
| σ(sheet) | 1.617 Ω/□ | 3.195 Ω/□ |
| σ(bulk) | 14.22 μΩ·cm | 16.71 μΩ·cm |
| consumption rate | 0.143 mg/cycle | 0.185 mg/cycle |
| thickness difference (nm) | SUMMARY | 12 |
| etch rate |  | 012 Å/cycle |

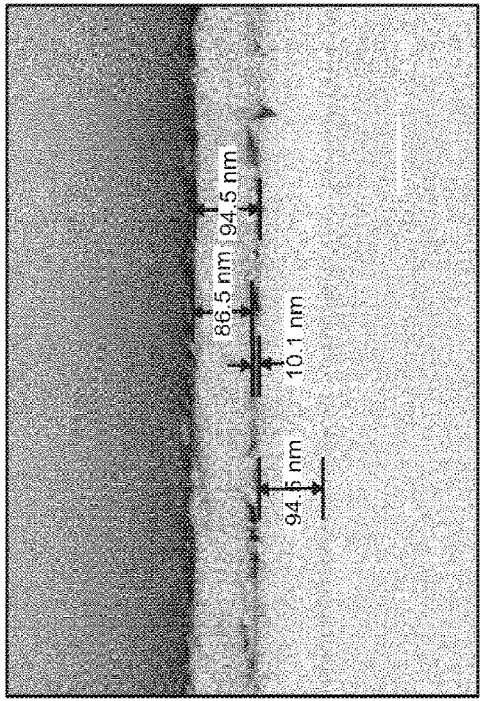
FIG. 10A
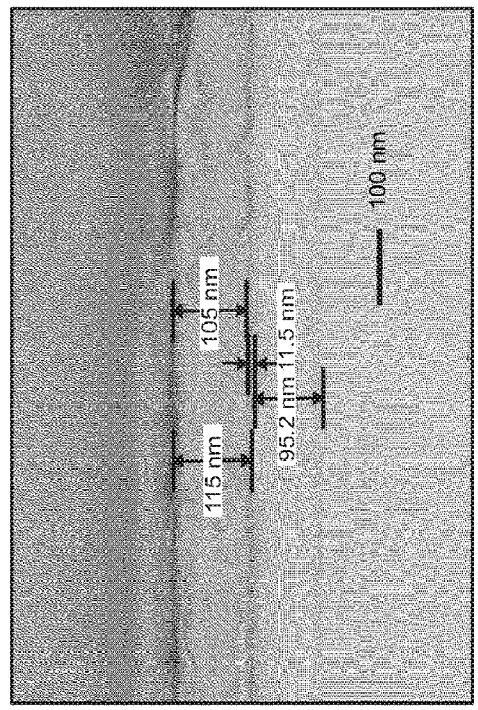
FIG. 10B
| | Before Etching | After Etching for 1500 cycles |
|---|---|---|
| σ(sheet) | 1.2492 Ω/□ | 1.732 Ω/□ |
| σ(bulk) | 12.49 μΩ-cm | 15.12 μΩ-cm |
| consumption rate | 0.16 mg/cycle | 0.166 mg/cycle |
| | SUMMARY | |
| thickness difference (nm) | 16 | |
| etch rate | 0.106 Å/cycle | |
FIG. 10C

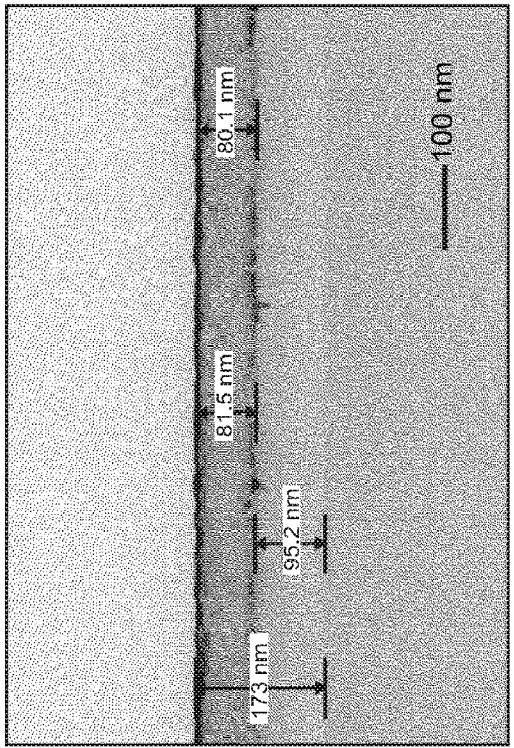
FIG. 11A
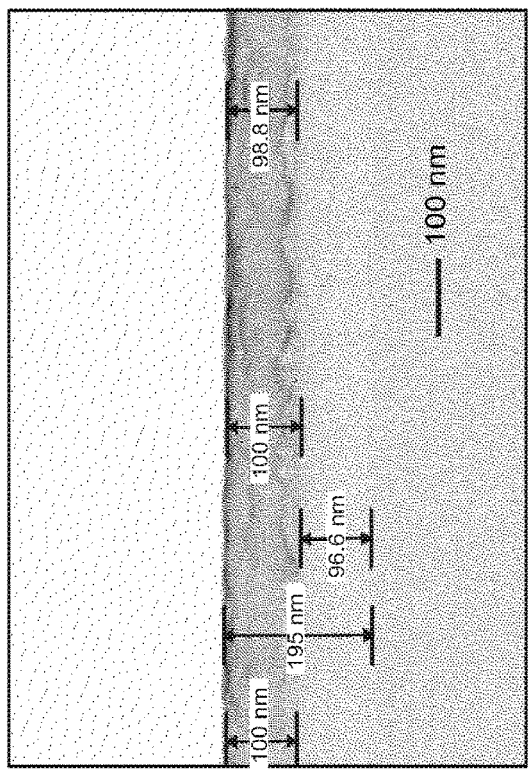
FIG. 11B
| | Before Etching | After Etching for 2000 cycles |
|---|---|---|
| σ(sheet) | 1.617 Ω/□ | 2.00 Ω/□ |
| σ(bulk) | 14.22 μΩ-cm | 14.2 μΩ-cm |
| consumption rate | 0.143 mg/cycle | 0.188 mg/cycle |
| | SUMMARY | |
| thickness difference (nm) | 18 | |
| etch rate | 0.092 Å/cycle | |
FIG. 11C

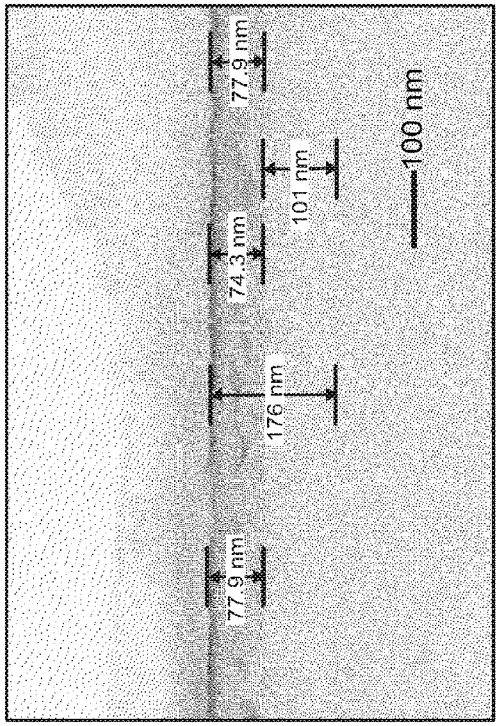
*FIG. 12A*
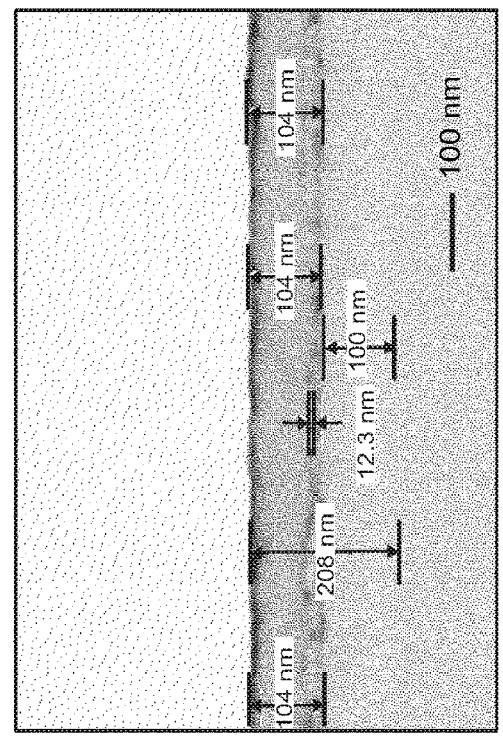
*FIG. 12B*
| | Before Etching | After Etching for 2500 cycles |
|---|---|---|
| σ(sheet) | 1.4375 Ω/□ | 2.501 Ω/□ |
| σ(bulk) | 13.56 μΩ - cm | 19.84 μΩ - cm |
| consumption rate | 0.156 mg/cycle | 0.188 mg/cycle |
| | SUMMARY | |
| thickness difference (nm) | 25 | |
| etch rate | 0.102 Å/cycle | |
*FIG. 12C*

| No. of Cycles | Thickness (nm) | | Bulk resistivity (μΩ-cm) | | Thickness Difference (nm) | Etch Rate (Å/cycle) |
|---|---|---|---|---|---|---|
| | before | after | before | after | | |
| 1000 | 63.97 | 52.29 | 14.23 | 16.71 | 11.68 | 0.117 |
| 1500 | 103 | 87.1 | 12.49 | 15.12 | 15.9 | 0.106 |
| 2000 | 89.58 | 71.22 | 14.2 | 14.2 | 18.36 | 0.092 |
| 2500 | 94.83 | 69.33 | 13.59 | 19.84 | 25.49 | 0.102 |

FIG. 13

| No. of Cycles | Etch rate (Å/cycle) | Thickness Difference (nm) |
|---|---|---|
| 1000 | 0.12 | 12 |
| 1500 | 0.11 | 16 |
| 2000 | 0.09 | 18 |
| 2500 | 0.1 | 25 |

METHOD FOR ETCHING A METAL SURFACE

CROSS-REFERENCE TO RELATED APPLICATION

This application is the U.S. national phase of PCT Appln. No. PCT/US2017/025270 filed Mar. 31, 2017 which claims the benefit of U.S. provisional application Ser. No. 62/316,903 filed Apr. 1, 2016, the disclosures of which are incorporated in their entirety by reference herein.

TECHNICAL FIELD

In at least one aspect, the present invention is related to a method for reducing the thicknesses of metal films.

BACKGROUND

Atomic layer deposition (ALD) is a film growth method that leads to precise film thickness control and perfect conformal coverage of nanoscale features due to its layer-by-layer, self-limited growth mechanism. Because of these attributes, ALD is currently being implemented as a key film growth method in the world-wide microelectronics industry. While film growth by ALD is allowing huge advances in microelectronics manufacturing, film etching with precise thickness removal is equally important but very poorly developed.

The opposite of ALD is atomic layer etching (ALE), where films are etched with a layer-by-layer, self-limited mechanism. ALE has just emerged from industrial secrecy, largely because its focused development is needed by the microelectronics industry to keep pace with device miniaturization. To date, ALE has been mostly focused on plasma-based processes. However, plasma ALE requires expensive equipment and the energetic plasma ions can damage substrates, films, and equipment. Accordingly, there is an urgent need to develop thermal ALE processes, which use carefully designed, exothermic chemical reactions to achieve etching. The first thermal ALE processes were only reported in 2015 for $Al_2O_3$, $AlF_3$, and $HfO_2$ films. These processes employ hydrogen fluoride as a precursor, which is highly toxic and highly corrosive toward metal reactor parts.

A significant advance in recent years is the encapsulation of copper features by cobalt metal liners. These cobalt lines stop the electro-migration of copper metal in devices and allow the continuous decrease in copper feature sizes. ALD is an enabling technology in the deposition of cobalt liners and caps. The thermal ALE of cobalt metal would be incredibly valuable for the manipulation of cobalt liners and caps, however, there no literature reports of the thermal ALE of cobalt or other metals to date. Numerous recent advances in the thermal ALD growth of electropositive metal films, including cobalt metal, have been reported.

Accordingly, there is a need for the development of thermal ALE process and in particular, thermal ALE for etching cobalt.

SUMMARY

The present invention solves one or more problems of the prior art by providing in at least one embodiment, a method for etching a metal surface. The method includes a step of contacting a metal surface having metal atoms M with a protic compound for a first time period to produce a first modified surface. The first modified surface is contacted with a protic ligand-forming compound for a second time period that reacts with the first modified surface to form a volatile metal-containing compound including a metal atom and the protic ligand-forming compound. The volatile metal-containing compound is then removed resulting in the metal surface at least being partially etched.

In another embodiment, a method for etching an element surface is provided. The method includes a step of contacting an element surface having atoms therein with a protic compound for a first time period to produce a first modified surface. The first modified surface is contacted with a protic ligand-forming compound for a second time period that reacts with the first modified surface to form a volatile element-containing compound including an atom and the protic ligand-forming compound. The volatile element-containing compound is then removed resulting in the element surface at least being partially etched.

BRIEF DESCRIPTION OF THE DRAWINGS

FIG. 2A provides a scanning electron micrograph of a cobalt film on a platinum substrate before etching;

FIG. 2B provides a scanning electron micrograph for the film of FIG. 3A after 1000 ALE cycles at 150° C.;

FIG. 2C provides a table summarizing the results of FIGS. 2A and 2B;

FIG. 3A provides a scanning electron micrograph of a cobalt film on a platinum substrate before etching;

FIG. 3B provides a scanning electron micrograph for the film of FIG. 3A after 1000 ALE cycles at 160° C.;

FIG. 3C provides a table summarizing the results of FIGS. 3A and 3B;

FIG. 4A provides a scanning electron micrograph of a cobalt film on a platinum substrate before etching;

FIG. 4B provides a scanning electron micrograph for the film of FIG. 3A after 1000 ALE cycles at 180° C.;

FIG. 4C provides a table summarizing the results of FIGS. 2A and 2B;

FIG. 6A provides a scanning electron micrograph of a cobalt film on a platinum substrate before etching;

FIG. 6B provides a scanning electron micrograph for the film of FIG. 3A after 1000 ALE cycles at 220° C.;

FIG. 6C provides a table summarizing the results of FIGS. 2A and 2B;

FIG. 7A provides a scanning electron micrograph of a cobalt film on a platinum substrate before etching;

FIG. 7B provides a scanning electron micrograph for the film of FIG. 3A after 1000 ALE cycles at 240° C.;

FIG. 7C provides a table summarizing the results of FIGS. 2A and 2B;

FIG. 10A is an SEM of a cross section of a cobalt film on a platinum substrate;

FIG. 10B is an SEM of the cobalt film of FIG. 10A after 1500 etch cycles;

FIG. 10C is a table summarizing the properties of the cobalt films of FIGS. 10A and 10B and the etching results thereof;

FIG. 11A is an SEM of a cross section of a cobalt film on a platinum substrate;

FIG. 11B is an SEM of the cobalt film of FIG. 11A after 2000 etch cycles;

FIG. 11C is a table summarizing the properties of the cobalt films of FIGS. 11A and 11B and the etching results thereof;

FIG. 12A is an SEM of a cross section of a cobalt film on a platinum substrate;

FIG. 12B is an SEM of the cobalt film of FIG. 12A after 2500 etch cycles;

FIG. 12C is a table summarizing the properties of the cobalt films of FIGS. 12A and 12B and the etching results thereof;

FIG. 13 is a table summarizing the thicknesses and bulk resistivities before and after etching;

DETAILED DESCRIPTION

Figure 1:
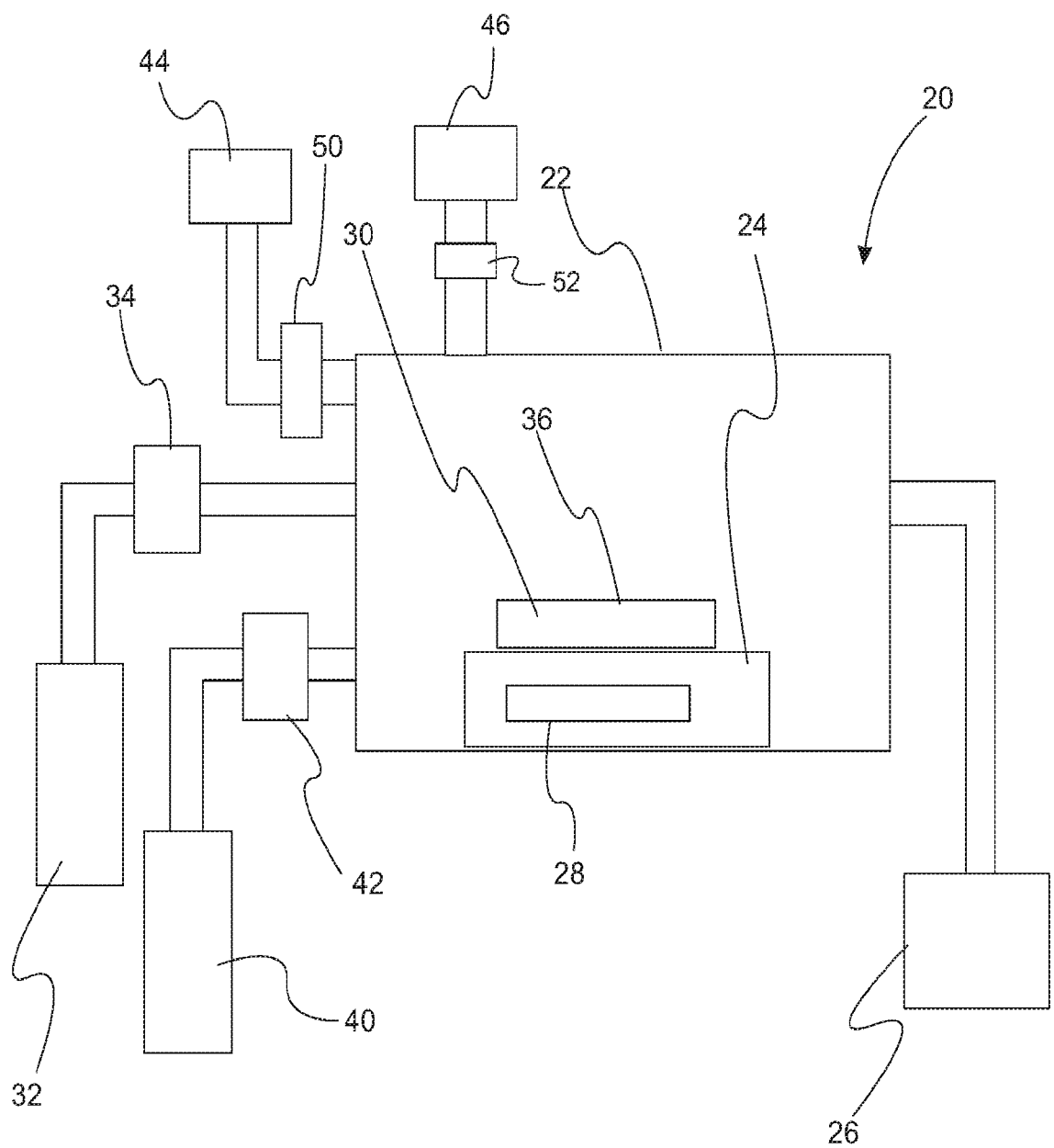
FIG. 1 is a schematic of an ALD system than can be used for etching metal films.
Figures 5A, 5B, 5C:
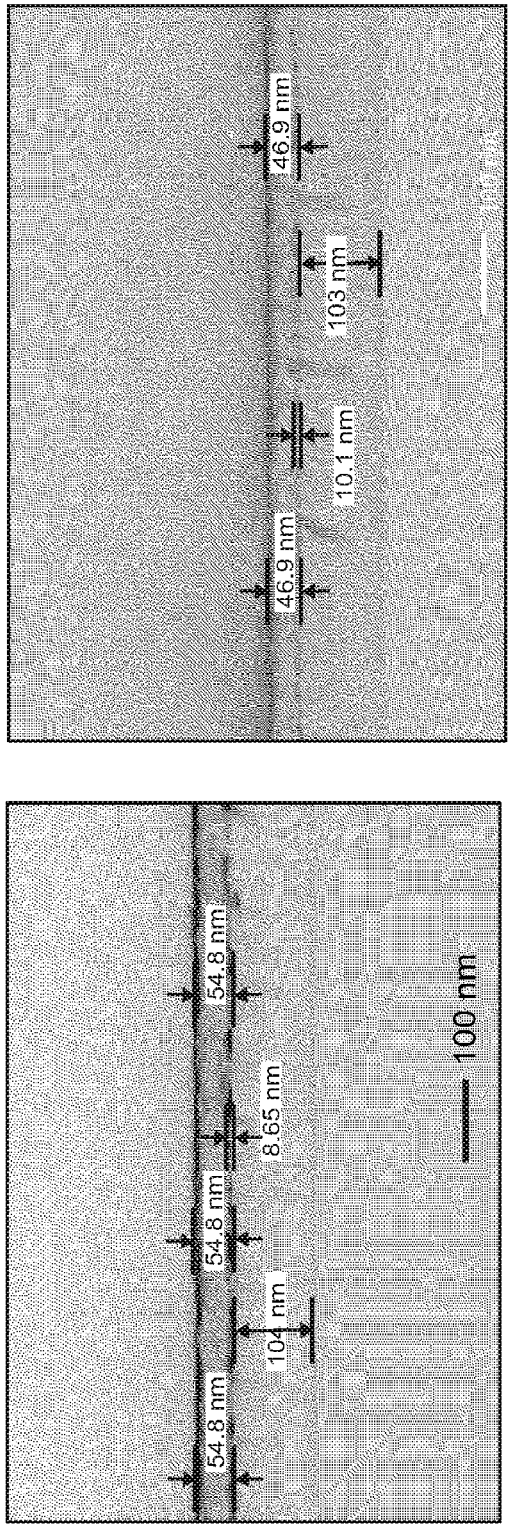
FIG. 5A provides a scanning electron micrograph of a cobalt film on a platinum substrate before etching.
FIG. 5B provides a scanning electron micrograph for the film of FIG. 3A after 1000 ALE cycles at 200° C.
FIG. 5C provides a table summarizing the results of FIGS. 2A and 2B.

Reference will now be made in detail to presently preferred compositions, embodiments and methods of the present invention, which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

Except in the examples, or where otherwise expressly indicated, all numerical quantities in this description indicating amounts of material or conditions of reaction and/or use are to be understood as modified by the word "about" in describing the broadest scope of the invention. Practice within the numerical limits stated is generally preferred. Also, unless expressly stated to the contrary: all R groups (e.g. $R_i$ where i is an integer) include alkyl, lower alkyl, $C_{1-6}$ alkyl, $C_{6-10}$ aryl, or $C_{6-10}$ heteroaryl; single letters (e.g., "n" or "o") are 1, 2, 3, 4, or 5; percent, "parts of," and ratio values are by weight; the term "polymer" includes "oligomer," "copolymer," "terpolymer," and the like; molecular weights provided for any polymers refers to weight average molecular weight unless otherwise indicated; the description of a group or class of materials as suitable or preferred for a given purpose in connection with the invention implies that mixtures of any two or more of the members of the group or class are equally suitable or preferred; description of constituents in chemical terms refers to the constituents at the time of addition to any combination specified in the description, and does not necessarily preclude chemical interactions among the constituents of a mixture once mixed; the first definition of an acronym or other abbreviation applies to all subsequent uses herein of the same abbreviation and applies mutatis mutandis to normal grammatical variations of the initially defined abbreviation; and, unless expressly stated to the contrary, measurement of a property is determined by the same technique as previously or later referenced for the same property.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

The term "comprising" is synonymous with "including," "having," "containing," or "characterized by." These terms are inclusive and open-ended and do not exclude additional, unrecited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

With respect to the terms "comprising," "consisting of," and "consisting essentially of," where one of these three terms is used herein, the presently disclosed and claimed subject matter can include the use of either of the other two terms.

Throughout this application, where publications are referenced, the disclosures of these publications in their entireties are hereby incorporated by reference into this application to more fully describe the state of the art to which this invention pertains.

The term "alkyl", as used herein, unless otherwise indicated, includes $C_{1-12}$ saturated monovalent hydrocarbon radicals having straight or branched moieties, including, but not limited to, methyl, ethyl, n-propyl, iso-propyl, n-butyl, sec-butyl, tert-butyl, and the like.

The term "protic compound" means a compound that that has a hydrogen atom bound to an oxygen (as in a hydroxyl group) or a nitrogen (as in an amine group). In general terms, any compound that contains labile $H^+$ is called a protic compound. The molecules of such compound readily donate protons ($H^+$) to reagents. A protic ligand-forming compound is an example of a protic compound that can react with a metal for form a ligand attached to the metal. Tautomers of such compounds will also be considered to be protic compounds.

Abbreviations:

"ALE" means atomic layer etching.

$^{tBu2}$DAD means 1,4-di-tert-butyl-1,3-diazabutadiene.

In an embodiment of the present invention, a method for etching a metal surface is provided. The method includes a step of contacting a metal surface (or element surface) having metal atoms M (or atoms including metal, transition metals, and other main group atoms therein) with a protic compound for a first time period to produce a first modified surface. In this context, an element surface is the surface of a solid material (at 25° C.) which may or may not be metallic. Typically, the metal surface is the surface of a metal film deposited on a substrate. In a variation, the metal surface (or substrate temperature is from 50° C. to 300° C. In a variation, M is a transition metal. In a refinement, M is a metal selected from Groups 2 to 12 of the Periodic Table. Examples of useful transition metals for M include, but are not limited to, Cu, Ni, Co, Cr, Mn, Fe, W, Mo, Ti, Zr, Hf, Rf, V, Nb, Ta, Re, Ru, Rh, Ir, Pd, Pt, and Au. In another refinement, M is Zn, Mg, Cr, Mn, Fe, Co, Ni, or Cu. Examples of suitable protic compounds include ammonia, $C_{1-6}$ carboxylic acids, $C_{1-6}$ primary alcohols, $C_{2-8}$ secondary alcohols, $C_{6-10}$ phenols, $C_{1-6}$ primary amines, $C_{2-8}$ secondary amines, and combinations thereof. Many other hydrogen-containing compounds should also serve as suitable protic compounds. The first modified surface is contacted with a ligand-forming compound that reacts with the first modified surface to form a volatile metal-containing compound including a metal atom and a ligand. In a refinement, the ligand-forming compound is a protic ligand forming compound. The volatile metal-containing compound is removed from the vicinity of the metal surface typically in a purging step with an inert gas. In a variation, the first time period and the second time period are each independently from 0.0001 to 200 seconds. In a variation, halogens or hydrogen halides are not used. In another variation, each step of the etching method is performed at a temperature from 50° C. to 300° C. In a refinement, each step of the etching method is performed at a temperature from 120° C. to 200° C. In still refinement, each step of the etching method is performed at a temperature from 160° C. to 200° C. In some variations, the amount of halogens or hydrogen halides present in compositions used in these steps is less than, in increasing order of preference, 1, 0.5, 0.1, 0.01, 0.001, or 0.0001 weight percent of any composition used in these steps. In refinements of these variations, the amount of halogens or hydrogen halides is typically greater than or equal to 0.0000001 weight percent of compositions used in these steps. Advantageously, the present embodiment provides the first thermal ALE processes for electropositive metal films.

One skilled in the art of inorganic and organometallic chemistry will recognize that a number of ligand-forming compounds can be used in practicing the invention. Examples of such ligand-forming compounds are provided by the following formulae:

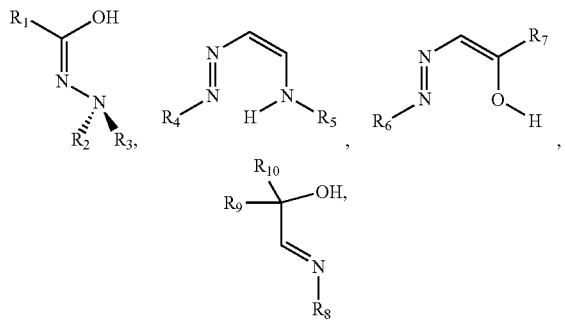

and keto-enol or enamine-imine tautomers thereof; wherein $R_1$, $R_2$, $R_3$, $R_4$, $R_5$, $R_6$, $R_7$, $R_8$, $R_9$, $R_{10}$ are each independently H or $C_{1-12}$ alkyl or $N(R_{11})_2$ and $R_{11}$ is $C_{1-12}$ alkyl. In a refinement, $R_1$, $R_2$, $R_3$, $R_4$, $R_5$, $R_6$, $R_7$, $R_8$, $R_9$, $R_{10}$, $R_{11}$ are each independently H, methyl, ethyl, n-propyl, iso-propyl, n-butyl, sec-butyl, or tert-butyl. In this regard, the following ligand-forming compounds can also be used:

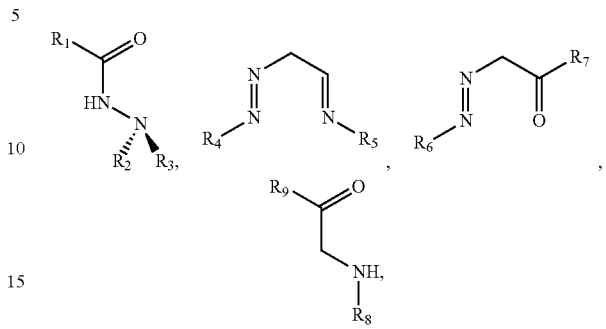

where $R_1$, $R_2$, $R_3$, $R_4$, $R_5$, $R_6$, $R_7$, $R_8$, $R_9$, $R_{11}$ are as set forth above. Specific examples of such compounds include, but are not limited to:

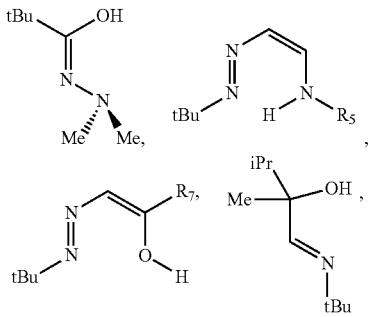

and tautomers thereof; and combinations thereof where $R_5$, $R_7$ are each independently H, $C_{1-12}$ alkyl or $N(R_{11})_2$ and $R_{11}$ is $C_{1-12}$ alkyl. In a refinement, $R_5$, $R_7$, $R_{11}$ are each independently H, methyl, ethyl, n-propyl, iso-propyl, n-butyl, sec-butyl, or tert-butyl. In another refinement, $R_5$ is tert-butyl or $NMe_2$. In another refinement, $R_7$ is iso-propyl or tert-butyl. It should be appreciated that many different kinds of ligands can be used so long as the protic ligand-forming compound forms a volatile, thermally stable metal complex (e.g., $CoL_2$) when reacted with a metal film. Examples of other useful ligand forming compounds include, but are not limited to, diketones, imino ketones, diketimines, and the like. Other examples of useful ligand-forming compounds are also found in U.S. Pat. Nos. 9,255,327 and 8,907,115 and U.S. Pub. Nos. 20150159273 and 20140234550; the entire disclosures of which are hereby incorporated by reference.

The ALE is typically carried out in an ALD reactor such as those disclosed in U.S. Pat. Nos. 9,255,327 and 8,907,115 and U.S. Pub. Nos. 2015/0159273 and 2014/0234550; the entire disclosures of which are hereby incorporated by reference. In a variation, the ALE steps are repeated from 1 to 10,000 times. In some variations, the reactor in which the etching is conducted is purged with an inert gas (e.g., $N_2$, He, Ar, etc.) after the metal surface is contacted with a protic acid and after the modified surface is contacted with the ligand-forming compound.

With reference to FIG. 1, a schematic of an ALD system that can be used for etching or depositing metal films is provided. ALD system 20 includes reaction chamber 22, substrate holder 24, and vacuum pump 26. Typically, the substrate is heated via heater 28. The method has a deposition cycle comprising contacting substrate 30 with a vapor of a ligand-forming compound as set forth above. In particular, the vapor is introduced from ligand source 32 into reaction chamber 22 for a predetermined pulse time. The pulse time is controlled via control valve 34. In a refinement, the method further comprises removing at least a portion of the vapor of the ligand-forming compound that is lingering in the gas phase (i.e., has not adsorbed or reacted with the substrate) from the vicinity of the substrate in between each etch cycle. The ligand-forming compound is removed in purging steps by introducing a purge gas from purge source 40 into reaction chamber 22 for a predetermined purge time. The purge time is controlled by control valve 42. Also depicted in FIG. 1 are reagent sources 44, 46 which can be used to deposit films by ALD. Control valves 50, 52 are respectively associated with reagent sources 40, 42, 44 and used to introduce pulses of these reagents into ALD system 20.

During etching by the method of the present embodiment, the substrate temperature will be at a temperature suitable to the properties of the chemical precursor(s) and volatile compound to be formed. In a refinement of the method, the substrate is set to a temperature from about 0 to 1000° C. In another refinement of the method, the substrate has a temperature from about 50 to 450° C. In another refinement of the method, the substrate has a temperature from about 100 to 250° C. In still another refinement of the method, the substrate has a temperature from about 150 to 400° C. In still another refinement of the method, the substrate has a temperature from about 200 to 300° C. In still another refinement of the method, the substrate has a temperature from about 50 to 300° C. In yet another refinement of the method, the substrate has a temperature from about 120° C. to 200° C. In yet another refinement of the method, the substrate has a temperature from about 160° C. to 200° C.

Similarly, the pressure during etching is set at a value suitable to the properties of the chemical protic compound and ligand-forming compound and the volatile compound to be formed. In one refinement, the pressure is from about $10^{-6}$ Torr to about 760 Torr. In another refinement, the pressure is from about 0.1 millitorr to about 10 Torr. In still another refinement, the pressure is from about 1 to about 100 millitorr. In yet another refinement, the pressure is from about 1 to 20 millitorr.

Pulse times and purge times also depend on the properties of the chemical precursors and the geometric shape of the substrates. Etching on flat substrates uses short pulse and purge times, but pulse and purge times in ALE on 3-dimensional substrates can be very long. Therefore, in one refinement, pulse times and purge times are each independently from about 0.0001 to 200 seconds. In another refinement, pulse and purge times are each independently from about 0.1 to about 10 seconds.

The following examples illustrate the various embodiments of the present invention. Those skilled in the art will recognize many variations that are within the spirit of the present invention and scope of the claims.

The ALE of cobalt metal films, which were grown by ALD using our recently reported process with $Co(^{tBu2}DAD)_2$ and formic acid at 180° C. on Ru or Pt substrates were examined. For these experiments, the process outlined in equations 1 and 2 was envisioned.

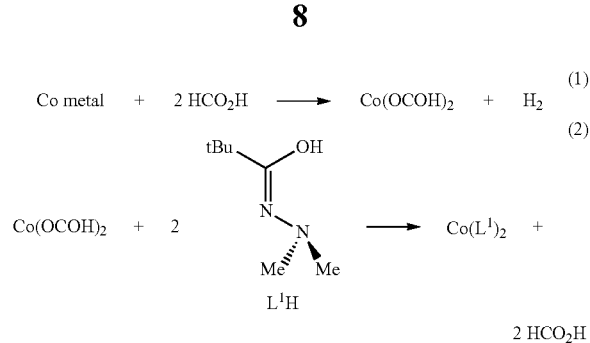

Treatment of the cobalt metal substrate with formic acid is believed to oxidize the surface cobalt atoms to cobalt(II) formate, along with evolution of $H_2$. Subsequent treatment of this formate-modified surface layer with ligand-forming compound $L^1H$ should afford proton transfer to form volatile $Co(L^1)_2$ and volatile formic acid. If the surface oxidation by formic acid is self-limiting, then the loss of volatile $Co(L^1)_2$ should also occur in self-limiting fashion. The synthesis and structure of $Co(L^1)_2$ has recently been reported, and found that it sublimes at 75° C./0.05 Torr and undergoes solid state thermal decomposition at 245° C. (see, Karunarathne, M. C.; Knisley, T. J.; Tunstull, G. S.; Heeg, M. J.; Winter, C. H. Polyhedron 2013, 52, 820-830). Accordingly, $Co(L^1)_2$ is highly volatile, thermally stable below 245° C., and is believed to rapidly volatilize from the surface upon formation as long as the etch temperature is below 245° C.

FIGS. 2-7 provide ALE experimental results at etching temperatures of 150, 160, 180, 200, 220, and 240° C. In each of these experiments, a cobalt film on platinum is contacted with formic acid with a pulse of 0.2 second following by a $N_2$ purge pulse of 10 seconds. Then the sample is contacted with ligand-forming compound $L^1H$ with a pulse of 5 seconds following by a $N_2$ purge pulse of 10 seconds. Typically, the source for $L^1H$ is at a temperature of about 70° C. This sequence is repeated for 1000 cycles. Ligand-forming compound $L^1H$ can be described by either of the following tautomeric forms which are expected to be in equilibrium:

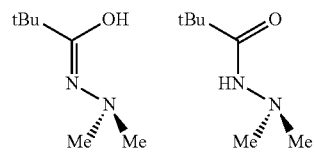

Figures 8A, 8B:
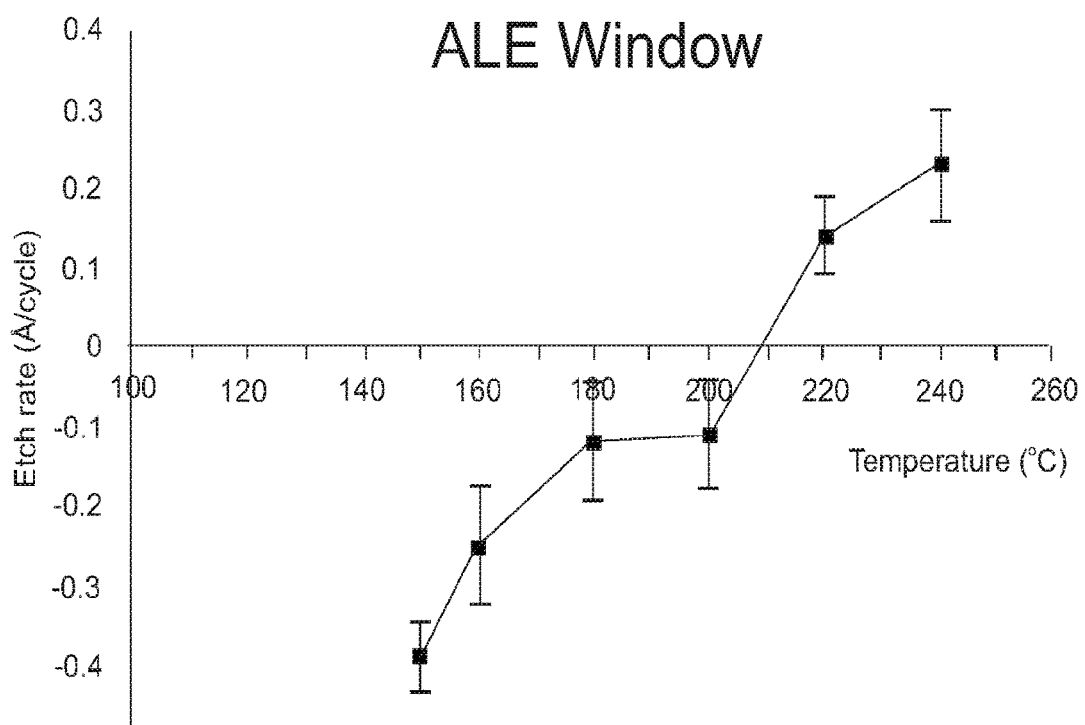
FIG. 8A is a table summarizing the results of FIGS. 2-7.
FIG. 8B is a plot of etch rate/cycle versus temperature summarizing the results of FIGS. 2-7.
Figures 9A, 9B, 9C:
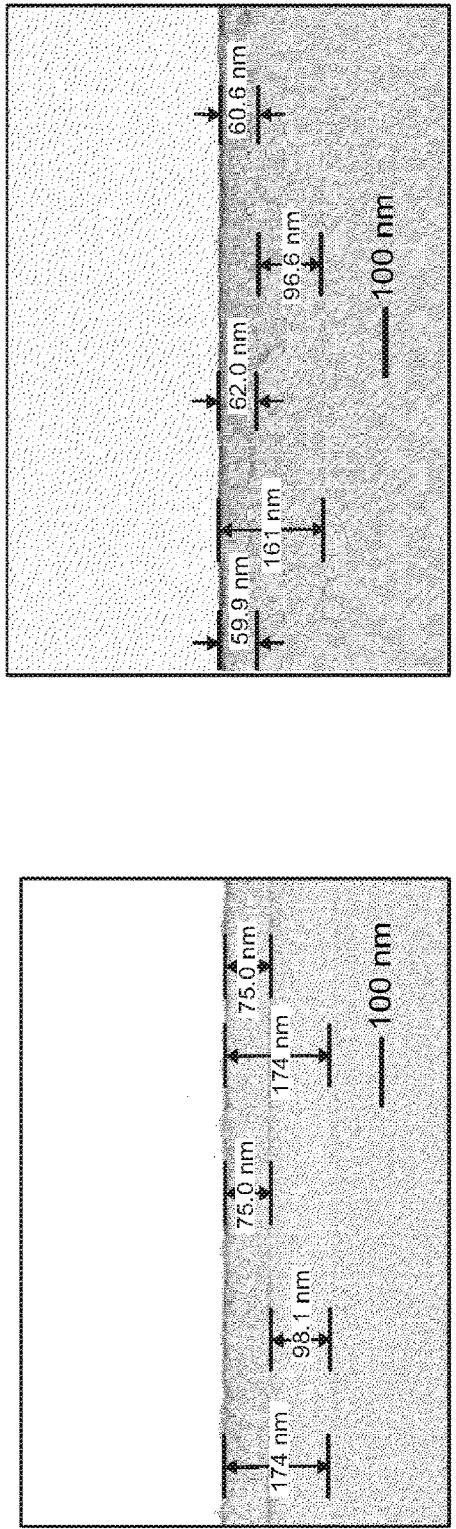
FIG. 9A is an SEM of a cross section of a cobalt film on a platinum substrate.
FIG. 9B is an SEM of the cobalt film of FIG. 9A after 1000 etch cycles.
FIG. 9C is a table summarizing the properties of the cobalt films of FIGS. 9A and 9B and the etching results thereof.

For these experiments, the thicknesses of the cobalt films before and after etching were measured by scanning electron microscopy (SEM). The results of these experiments are summarized in the table of FIG. 8A and the plot of FIG. 8B. In these figures, negative value for the etch rate indicate film removal while positive values indicate film growth. It is clear that an ALE window in which etching dominates occurs at temperature from about 160 to 200° C.

Figures 14A, 14B:
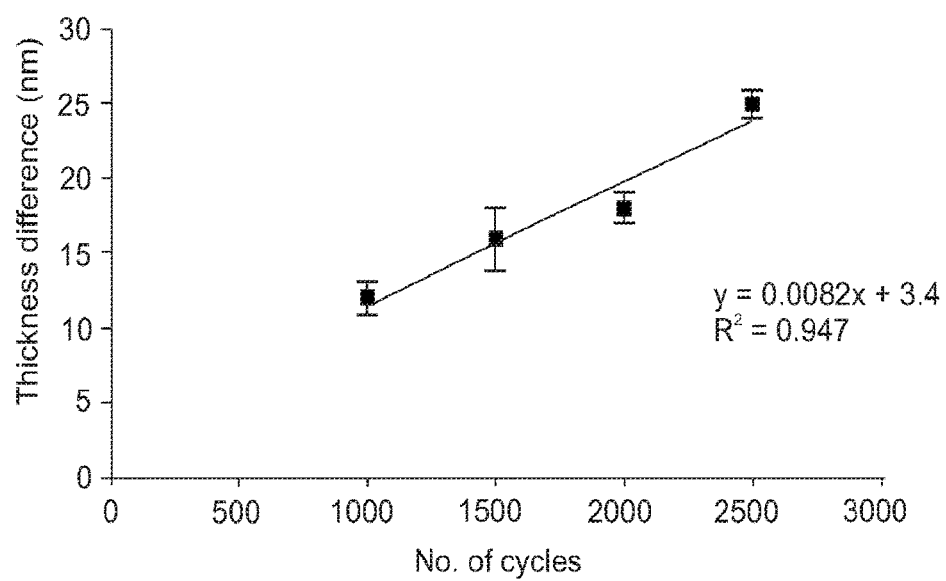
FIG. 14A is table summarizing the etch rate and thicknesses for the cobalt films of FIGS. 9 to 12.
FIG. 14B is a plot of thickness difference versus number of cycles for the cobalt films of FIGS. 9 to 12.

FIGS. 9-12 provide ALE experimental results for 1000, 1500, 2000, and 2500 etch cycles. In each of these experiments, a cobalt film is gown by an ALD process is which a platinum substrate is treated with formic acid for a 0.2 second pulse followed by a 10 second $N_2$ purge pulse. This is then followed by a 3 second pulse of $Co(^{tBu2}DAD)_2$ followed by a 10 second $N_2$ purge pulse. The $Co(^{tBu2}DAD)_2$ source is set to a temperature of about 140° C. The etching is accomplished by contacting the cobalt films on platinum with formic acid with a pulse of 0.2 seconds following by a N₂ purge pulse of 10 seconds. Then the sample is contacted with ligand-forming compound L¹H with a pulse of 5 seconds following by a N₂ purge pulse of 10 seconds. Typically, the source for L¹H is at a temperature of about 70° C. This sequence is repeated for 1000, 1500, 2000, and 2500 as indicated for FIGS. 9-12. The results for these experiments are summarized by FIGS. 13, 14A, and 14B. The table of FIG. 13 provides cobalt film resistivities measured before and after etching. The substrates had resistivities of ~12-14 microhm-cm prior to etching, and resistivities of 14-20 microohm cm after the etch steps. Accordingly, low resistivity cobalt metal is obtained upon etching. In particular, FIGS. 14A and 14B respectively show a table and a plot of cobalt layer thickness difference versus number of etch cycles. This plot gives an etch rate of ~0.08 Å/cycle.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method for etching a metal surface comprising:
a) contacting the metal surface having metal atoms M with a protic compound for a first time period to produce a first modified surface, the protic compound having labile H⁺;
b) contacting the first modified surface with a vapor of a protic ligand-forming compound for a second time period that reacts with the first modified surface to form a volatile metal-containing compound including a metal atom and the protic ligand-forming compound, wherein the protic ligand-forming compound is selected from the group consisting of:

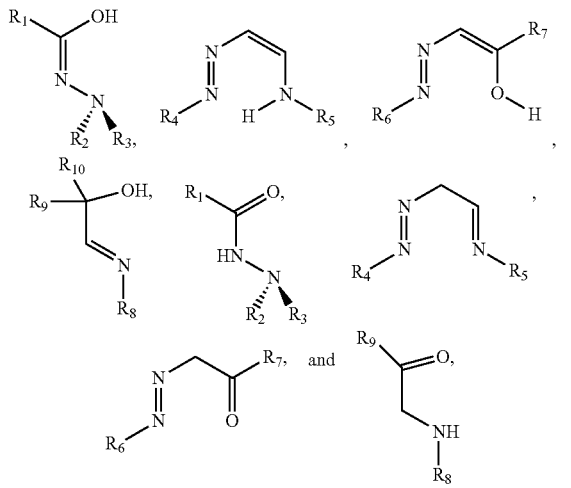

where $R_1$, $R_2$, $R_3$, $R_4$, $R_5$, $R_6$, $R_7$, $R_8$, $R_9$, $R_{10}$ are each independently H, $C_{1-12}$ alkyl or $N(R_{11})_2$ and $R_{11}$ is H or $C_{1-12}$ alkyl; and
c) removing the volatile metal-containing compound, wherein the pressure during etching is $10^{-6}$ Torr to about 760 Torr.

2. The method of claim 1 wherein protic compound is selected from the group consisting of $C_{1-6}$ carboxylic acids, $C_{1-6}$ primary alcohols, $C_{2-8}$ secondary alcohols, $C_{6-10}$ phenols, $C_{1-6}$ primary amines, $C_{2-8}$ secondary amines, and combinations thereof.

3. The method of claim 1 wherein the protic compound is formic acid.

4. The method of claim 1 wherein the protic ligand-forming compound is selected from the group consisting of:

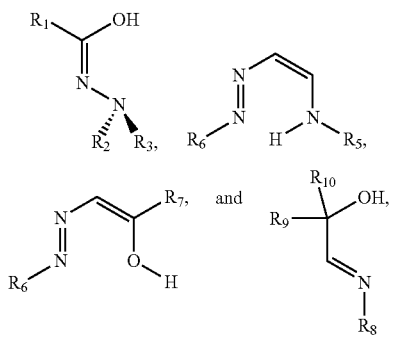

wherein $R_1$, $R_2$, $R_3$, $R_4$, $R_5$, $R_6$, $R_7$, $R_8$, $R_9$, $R_{10}$ are each independently H or $C_{1-12}$ alkyl or $N(R_{11})_2$ and $R_{11}$ is $C_{1-12}$ alkyl.

5. The method of claim 4 wherein $R_1$, $R_2$, $R_3$, $R_4$, $R_5$, $R_6$, $R_7$, $R_8$, $R_9$, $R_{10}$, $R_{11}$ are each independently H, methyl, ethyl, n-propyl, iso-propyl, n-butyl, sec-butyl, or tert-butyl.

6. The method of claim 1 wherein the protic ligand-forming compound is selected from the group consisting of:

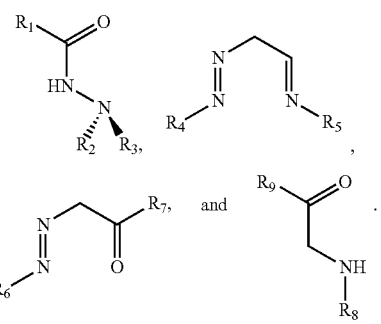

wherein $R_1$, $R_2$, $R_3$, $R_4$, $R_5$, $R_6$, $R_7$, $R_8$, $R_9$ are each independently H or $C_{1-12}$ alkyl or $N(R_{11})_2$ and $R_{11}$ is $C_{1-12}$ alkyl.

7. The method of claim 6 wherein $R_1$, $R_2$, $R_3$, $R_4$, $R_5$, $R_6$, $R_7$, $R_8$, $R_9$, $R_{11}$ are each independently H, methyl, ethyl, n-propyl, iso-propyl, n-butyl, sec-butyl, or tert-butyl.

8. The method of claim 1 wherein the protic ligand-forming compound is selected from the group consisting of:

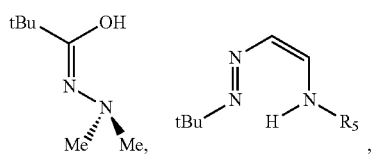

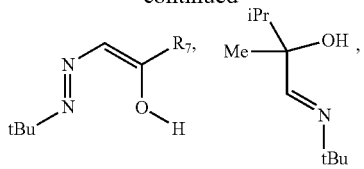

and tautomers thereof;
where $R_5$, $R_7$ are each independently H, $C_{1-12}$ alkyl or $N(R_{11})_2$ and $R_{11}$ is $C_{1-12}$ alkyl.

9. The method of claim 8 wherein $R_5$, $R_7$, $R_{11}$ are each independently H, methyl, ethyl, n-propyl, iso-propyl, n-butyl, sec-butyl, or tert-butyl.

10. The method of claim 1 wherein the first time period and the second time period are each independently from 0.0001 to 200 seconds.

11. The method of claim 1 wherein M is a transition metal.

12. The method of claim 1 wherein M is a metal selected from Groups 2 to 12 of the Periodic Table.

13. The method of claim 1 wherein M is Zn, Mg, Cr, Mn, Fe, Co, Ni, or Cu.

14. The method of claim 1 wherein steps a, b, and c are repeated from 1 to 10,000 times.

15. The method of claim 1 wherein steps a, b, and c are performed at a temperature from 50° C. to 300° C.

16. The method of claim 1 wherein the protic ligand-forming compound is a compound selected from the group consisting of diketones, imino ketones, and diketimines.

17. A method for etching a surface comprising:
a) contacting an element surface having atoms therein with a protic compound for a first time period to produce a first modified surface, the protic compound having labile $H^+$;
b) contacting the first modified surface with a vapor of a protic ligand-forming compound for a second time period that reacts with the first modified surface to form a volatile element-containing compound including a metal atom and the protic ligand-forming compound, wherein the protic ligand-forming compound is selected from the group consisting of:

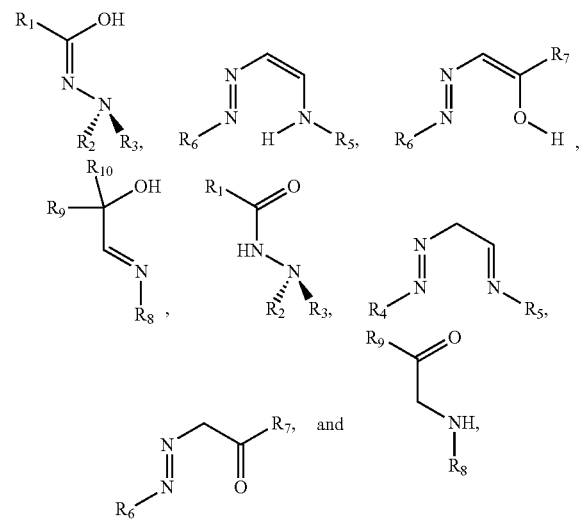

where $R_1$, $R_2$, $R_3$, $R_4$, $R_5$, $R_6$, $R_7$, $R_8$, $R_9$, $R_{10}$ are each independently H, $C_{1-12}$ alkyl or $N(R_{11})_2$ and $R_{11}$ is H or $C_{1-12}$ alkyl; and c) removing the volatile element-containing compound, wherein the pressure during etching is $10^{-6}$ Torr to about 760 Torr.

18. The method of claim 17 wherein protic compound is selected from the group consisting of $C_{1-6}$ carboxylic acids, $C_{1-6}$ primary alcohols, $C_{2-8}$ secondary alcohols, $C_{6-10}$ phenols, $C_{1-6}$ primary amines, $C_{2-8}$ secondary amines, and combinations thereof.

19. The method of claim 17 wherein the protic compound is formic acid.

20. The method of claim 17 wherein the protic ligand-forming compound is selected from the group consisting of:

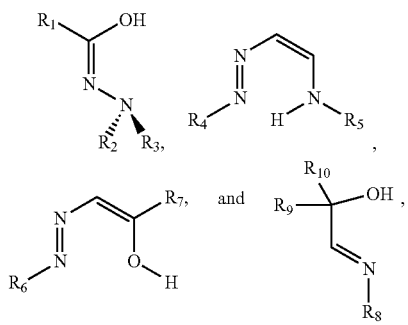

wherein $R_1$, $R_2$, $R_3$, $R_4$, $R_5$, $R_6$, $R_7$, $R_8$, $R_9$, $R_{10}$ are each independently H or $C_{1-12}$ alkyl or $N(R_{11})_2$ and $R_{11}$ is $C_{1-12}$ alkyl.

21. The method of claim 20 wherein $R_1$, $R_2$, $R_3$, $R_4$, $R_5$, $R_6$, $R_7$, $R_8$, $R_9$, $R_{10}$, $R_{11}$ are each independently H, methyl, ethyl, n-propyl, iso-propyl, n-butyl, sec-butyl, or tert-butyl.

22. The method of claim 17 wherein the protic ligand-forming compound is selected from the group consisting of:

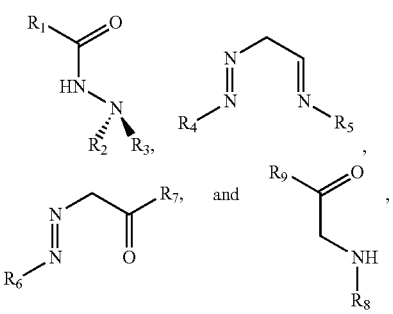

wherein $R_1$, $R_2$, $R_3$, $R_4$, $R_5$, $R_6$, $R_7$, $R_8$, $R_9$ are each independently H or $C_{1-12}$ alkyl or $N(R_{11})_2$ and $R_{11}$ is $C_{1-12}$ alkyl.

23. The method of claim 22 wherein $R_1$, $R_2$, $R_3$, $R_4$, $R_5$, $R_6$, $R_7$, $R_8$, $R_9$, $R_{11}$ are each independently H, methyl, ethyl, n-propyl, iso-propyl, n-butyl, sec-butyl, or tert-butyl.

24. The method of claim 17 wherein the first time period and the second time period are each independently from 0.0001 to 200 seconds.

25. The method of claim 17 wherein steps a, b, and c are performed at a temperature from 50° C. to 300° C. and wherein the pressure during etching is 0.1 millitorr to 10 Torr.

26. The method of claim 1 wherein the pressure during etching is 0.1 millitorr to 10 Torr.

27. The method of claim 1 wherein steps a), b), and c) are carried out in an atomic layer deposition reactor.

28. The method of claim 1 wherein the protic ligand-forming compound is selected from the group consisting of:

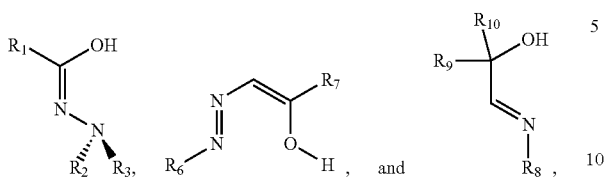

wherein $R_1$, $R_2$, $R_3$, $R_6$, $R_7$, $R_8$, $R_9$, $R_{10}$ are each independently H or $C_{1-12}$ alkyl or $N(R_{11})_2$ and $R_{11}$ is $C_{1-12}$ alkyl.

29. The method of claim 1 wherein the protic ligand-forming compound is selected from the group consisting of:

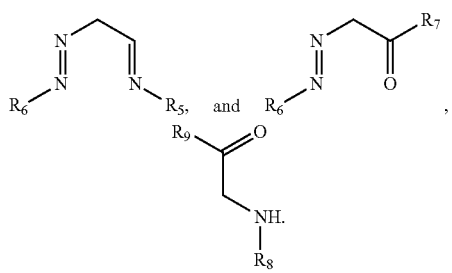

wherein $R_4$, $R_5$, $R_6$, $R_7$, $R_8$, $R_9$ are each independently H or $C_{1-12}$ alkyl or $N(R_{11})_2$ and $R_{11}$ is $C_{1-12}$ alkyl.

30. The method of claim 1 wherein the protic ligand-forming compound is selected from the group consisting of:

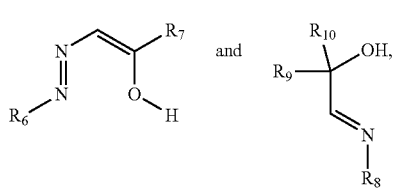

wherein $R_6$, $R_7$, $R_8$, $R_9$, $R_{10}$ are each independently H or $C_{1-12}$ alkyl or $N(R_{11})_2$ and $R_{11}$ is $C_{1-12}$ alkyl.

31. The method of claim 1 wherein the protic ligand-forming compound is selected from the group consisting of:

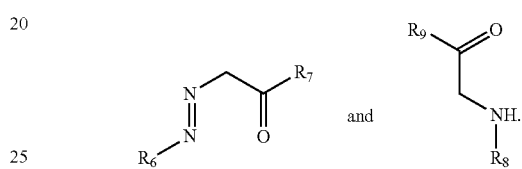

wherein $R_6$, $R_7$, $R_8$, $R_9$ are each independently H or $C_{1-12}$ alkyl or $N(R_{11})_2$ and $R_{11}$ is $C_{1-12}$ alkyl.

* * * * *